United States Patent [19]
Buie

[11] 3,981,072
[45] Sept. 21, 1976

[54] BIPOLAR TRANSISTOR CONSTRUCTION METHOD

[75] Inventor: James L. Buie, Panorama City, Calif.

[73] Assignee: TRW Inc., Redondo Beach, Calif.

[22] Filed: Dec. 6, 1974

[21] Appl. No.: 530,113

Related U.S. Application Data

[63] Continuation of Ser. No. 364,148, May 25, 1973, abandoned.

[52] U.S. Cl.................................. 29/578; 148/187; 357/91; 29/577
[51] Int. Cl.².......................................... B01J 17/00
[58] Field of Search.................. 29/578, 577, 576 B; 148/187; 96/36.2

[56] References Cited
UNITED STATES PATENTS

| | | | |
|---|---|---|---|
| 2,981,877 | 4/1961 | Noyce | 29/578 |
| 3,523,042 | 8/1970 | Bower | 29/576 B |
| 3,542,551 | 11/1970 | Rice | 96/36.2 |
| 3,615,929 | 10/1971 | Portnoy | 29/578 |
| 3,655,457 | 4/1972 | Duffy | 29/576 B |
| 3,833,429 | 9/1974 | Monma | 29/578 |

*Primary Examiner*—W. Tupman
*Attorney, Agent, or Firm*—Daniel T. Anderson; Jerry A. Dinardo; Edwin A. Oser

[57] ABSTRACT

A thick layer of silicon dioxide is grown on a semiconductive substrate and then etched to form an elongated opening that defines the outer boundaries of a diffused transistor. The thick silicon dioxide layer serves as a permanent fixed, diffusion mask. The first diffusion is performed through the permanent mask opening. Thereafter, portions of the elongated opening are masked by secondary thin layers of silicon dioxide or photo-resist, and subsequent diffusions are performed through different unmasked portions of the elongated opening.

5 Claims, 12 Drawing Figures

BIPOLAR TRANSISTOR CONSTRUCTION METHOD

This is a continuation of application Ser. No. 364,148, filed May 25, 1973, now abandoned.

CROSS-REFERENCE TO RELATED APPLICATIONS

This application discloses subject matter that is similar in some respects to that disclosed in concurrently filed, copending application Ser. No. 363,995, now U.S. Pat. No. 3,885,994 of Ralph W. Miller entitled BIPOLAR TRANSISTOR CONSTRUCTION METHOD, and assigned to the same assignee herein.

BACKGROUND OF THE INVENTION

1. Field of the Invention

This invention relates to LSI circuit construction of bipolar transistors, and more particularly to a method of fabricating such transistors which results in greatly reduced size.

2. Description of the Prior Art

There are presently two major objectives in current designs of large scale integrated circuits (LSI). First, to provide the maximum number of devices on a chip which is not so large as to be impractical to produce; and second, to maintain a specified operating speed while keeping the power dissipation low. For bipolar LSI, power dissipation is a severe problem. It is common to dissipate one milliwatt per device. For a chip containing 5,000 devices, this results in 5 watts of power dissipation per chip. It is apparent that this problem could become quite severe for chips containing 40 or 50 thousand devices.

Both of the problems given above can be attacked by reducing the size of an individual transistor. This allows more transistors to be placed upon a given sized chip and it reduces the parasitic capacitances of the transistor. The latter result permits operation at a given speed at a higher impedance level, thereby resulting in lower power dissipation.

In conventional LSI circuit construction, bipolar transistors are fabricated by a process which involves several steps of selective impurity diffusion into a semiconductive body or substrate. This process is sometimes called a triple diffusion process because three separate diffusion steps are carried out to form the collector, base, and emitter regions one within the other.

In order to define the regions where the diffusions will occur, a separate masking operation is performed for each of the several diffusions. According to one conventional procedure, the masking operation is performed by a photolithographic process that involves growing a masking oxide layer on the semiconductive substrate, coating the oxide layer with a photoresist, exposing the photoresist to light through a masking pattern, developing the photoresist pattern, and etching the oxide layer through the photoresist pattern until the semiconductive surface is reached and the diffusion regions are thereby defined.

An alternative practical method which has been used to mask selectively against an impurity deposition is as follows. A semiconductor wafer is coated directly with photoresist about one micron or more thick, the photoresist is exposed to light through a masking pattern, and the photoresist pattern is developed. The photoresist pattern remaining on the wafer can act as an in-situ mask against impurity deposition that is performed by an ion accelerator apparatus. The silicon wafer may have a thin surface oxide, in which case the ions are given sufficient energy, such as 130,000 electron volts for 1000 A silicon dioxide layers, to penetrate through the oxide but not through the photoresist. Alternatively, the oxide can be removed before ion implantation, in which case less ion implantation energy is required. After ion implantation, the photoresist is removed and the wafer is placed in a thermal diffusion furnace to diffuse and distribute the ion implanted impurity to the required depth.

The primary factor limiting the reduction of the size of a triple diffused transistor is the registration tolerance of the photolithographic process. The fabrication of a triple diffused bipolar transistor can be thought of in a simplified form as analogous to the fabrication of three nested bath tubs referred to as collector, base, and emitter in descending size. The collector is the largest region and is diffused in the substrate. The base is intermediate in size and is diffused in the collector region. The emitter is the smallest region and is diffused in the base region.

An important design rule for a transistor is that the bottom surfaces of the diffused regions or tubs must not touch one another. This requires that in the vertical dimension, the emitter diffusion layer is shallower than the base diffusion layer and the base diffusion layer is shallower than the collector diffusion layer. In the horizontal dimensions, it requires that the difference in size between adjacent regions or tubs be sufficient to assure that the tolerance with which they are placed within one another does not cause their edges to touch. This tolerance is the factor which limits the reduction of the size of triple diffused transistors.

SUMMARY OF THE INVENTION

In accordance with the invention, a process for fabricating a bipolar transistor comprises forming on a semiconductor substrate surface a first permanent mask with an elongated opening of predetermined length and width. A first diffusion is made through the entire mask opening. Second and third diffusions are subsequently made by masking different length portions of the elongated opening of the permanent mask so as to leave open areas of the same width but of smaller lengths than the original permanent mask opening, and then diffusing a second and third time through the open areas of the elongated mask opening.

DESCRIPTION OF THE PREFERRED EMBODIMENT

Figure 3:
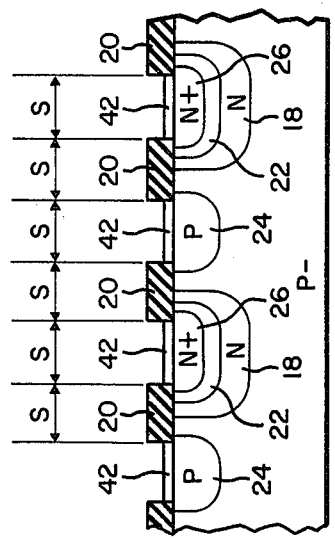
FIG. 3 is a sectional view taken along lines 3—3 of FIG. 1.
Figure 1:
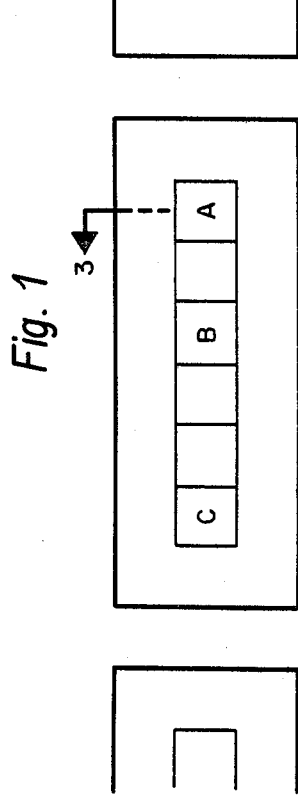
FIG. 1 is a top plan view of a portion of an LSI circuit incorporating an array of bipolar transistors of elongated extent.
Figure 2:
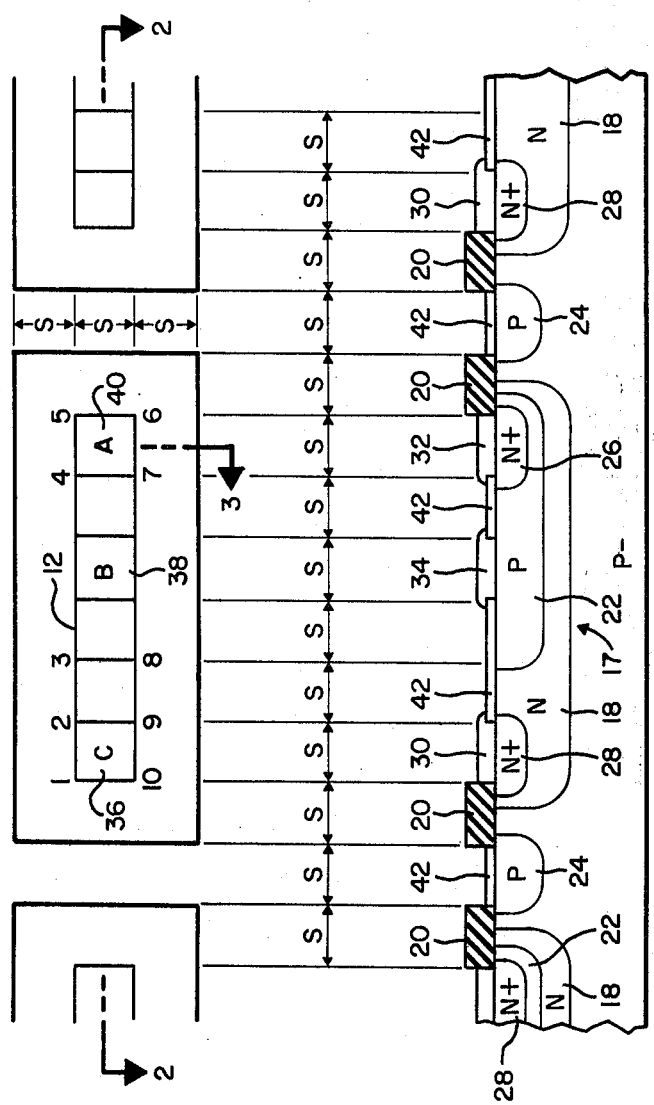
FIG. 2 is a sectional view taken along lines 2—2 of FIG. 1.

Referring now to FIGS. 1–3, there is shown a portion of an LSI circuit incorporating an array of bipolar transistors fabricated according to the method of the invention. The transistors are illustrated as being of the NPN type, although it is understood that the method of the invention is applicable as well to fabricating transistors of the PNP type. Each of the transistors in the top plan view of FIG. 1 is shown as being encompassed within a large elongated rectangle 10, two of which are shown in full and four others being shown only partially. Lying concentrically within each large rectangle 10 is a smaller elongated inner rectangle 12.

The rectangular strip area 14 between the two rectangles 10 and 12 represents the boundary of a permanent masking structure, which in combination with secondary masking structures serves to mask different portions of the area within the inner rectangle 12. The entire area within the inner rectangle 12 defines the region of the semiconductor or substrate that is exposed to the first impurity diffusion, whereas different portions of that rectangular area that are subsequently left unmasked serve to define the regions for the diffusions occurring after the first diffusion. More particularly, the rectangular strip area 14 is formed by depositing a very thick layer of silicon dioxide and then etching away selected portions of the thick layer. The secondary masking structures may be formed by depositing much thinner layers of silicon dioxide on the unmasked areas of the substrate and then etching away portions of the thin silicon dioxide layers. Alternatively, where ion implantation is used to deposit the impurity, the secondary masking structure may comprise a photoresist layer. Hereinafter, wherever a secondary mask is referred to, it will be understood that the secondary mask may comprise either a thin layer of silicon dioxide or a layer of photoresist.

The width of the inner rectangle 12 is identified as having a dimension S, and the length thereof is divided into six equal parts, each with a length equal to the dimension S. The large rectangle 10 is spaced from the smaller rectangle 12 by the dimension S. All of the large rectangles 10 are spaced from each other longitudinally and laterally by the same distance equal to the dimension S. The dimension S represents the smallest dimension practical for registration tolerances, which according to the present state of the art is 0.1 mil. The significance of the dimension S will become clearer as the description of the fabrication of the transistor structure proceeds.

Reference is now made to FIGS. 2 and 3 which show sectional views of the transistor structure. The LSI bipolar transistor array includes a substrate 16 or body of semiconductive material, in this case P type silicon. The substrate 16 contains a multiplicity of transistors 17 that are formed by diffusing various impurity concentrations in different regions of the substrate.

In the first operation collector regions 18 are formed by diffusing an N type impurity within the substrate 16. This is accomplished by forming a permanent mask 20, made from a thick layer of silicon dioxide, in the regions represented by the rectangular strip areas 14, and then superimposing a secondary mask over the permanent mask 20 and portions of the substrate 16, leaving only a rectangular opening concentrically between the rectangles 10 and 12. In FIG. 1, this first rectangular opening is represented by a horizontal line between points 1 and 5, a vertical line between points 5 and 6, a horizontal line between points 6 and 11, and a vertical line between points 11 and 1.

In the second operation base regions 22 are formed by diffusing a P type impurity within the collector region 18. This is accomplished by superimposing a secondary mask over the permanent mask 20 and portions of the substrate 16, leaving a rectangular opening between points 3, 5, 6, 8 and leaving exposed all of the substrate regions between the large rectangles 10. The rectangular opening is represented by a horizontal line between points 3 and 5, a vertical line between points 5 and 6, a horizontal line between points 6 and 8, and a vertical line between points 8 and 3. In addition to forming the P type base regions 22, this P type diffusion forms P type isolation regions 24 surrounding each of the transistors 17.

In the third operation, an N+ type impurity diffusion is performed to form an N+ type emitter region 26 within the base region 22 and an N+ type collector contact region 28 within the collector region 18. This diffusion is accomplished by superimposing a secondary mask over the permanent mask 20 and portions of the substate 16, leaving a rectangular opening between points 4, 5, 6, 7 and another rectangular opening between points 1, 2, 9, 11. One rectangular opening is represented, for example, by a horizontal line between points 4 and 5, a vertical line between points 5 and 6, a horizontal line between points 6 and 7, and a vertical line between points 7 and 4.

Finally, ohmic metallic contacts are made to the collector, emitter and base regions respectively. Thus a collector contact 30 is made to the collector region 18 by depositing metal on the collector contact region 28; an emitter contact 32 is made to the emitter region 26 by depositing metal on the emitter region 26; and a base contact 34 is made to the base region 22 by depositing metal on the base region 22. The ohmic metallic contacts to the semi-conductor, collector, emitter, and base regions are made by superimposing a thin layer silicon dioxide mask over the permanent mask 20 and over all semiconductor surface regions except for the square surface areas 36, 38, 40 exposing portions of the collector contact region 28, emitter region 26 and base region 22 respectively. The thin layer silicon dioxide mask is indicated by the reference numeral 42 in FIGS. 2 and 3. In FIG. 1, the surface areas 36, 38, 40 are labeled C, B, E respectively to indicate where contacts are made to the collector, base, and emitter.

Reading from left to right in FIGS. 1 and 2, it is seen that a spacing S is provided to form the diffused isolation region 24. Another spacing S is provided to space the isolation region 24 from the collector region 18 and the collector contact region 28, and yet another spacing S is provided to form the collector contact region 28. A spacing S is provided to space the collector contact region 28 from the base region 22, another spacing S is provided to space the base contact 34 from the edge of the base region 22, and a spacing S is provided for the width of the base contact 34. Finally, a spacing "S" spaces the base contact 34 from the emitter region 26, and another spacing S is provided to form the emitter contact 32.

Figure 4:
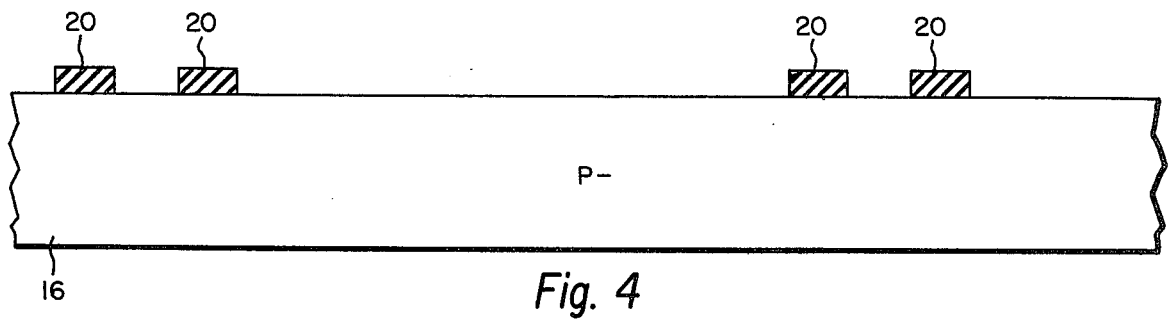
FIGS. 4–12 are sectional views illustrating the step by step fabrication of the LSI structure of FIGS. 1–3.

Reference will now be made to FIGS. 4–12 for a step by step description of the process of fabricating the transistor 17 according to the invention. On a substrate 16 of silicon that is lightly doped with a P type impurity, such as boron, there is formed a permanent mask 20 from a thick layer of silicon dioxide, as shown in FIG. 4.

The mask 20 is preferably formed by a photolithographic technique well known in the semiconductor art. According to this art, a continuous layer of silicon dioxide is formed on the silicon substrate 16. The silicon dioxide layer is formed by heating the substrate 16 in oxygen saturated with water vapor at a temperature of 1100°C for about four hours or until a layer is formed that is 9,000 to 10,000 angstroms in thickness. The thick layer of silicon dioxide is then covered with a photoresist.

Next, the photoresist is exposed to light of suitable wavelength passing through openings of a photographic mask that corresponds to the areas where the thick layer of silicon dioxide is to remain. The photoresist sets where the light strikes, and when treated with a solvent, the unexposed photoresist is washed away exposing some of the silicon dioxide. Upon treatment with buffered hydrofluoric acid, the exposed silicon dioxide is etched away while the areas of silicon dioxide that are coated with the set photoresist are left intact.

Figure 5:
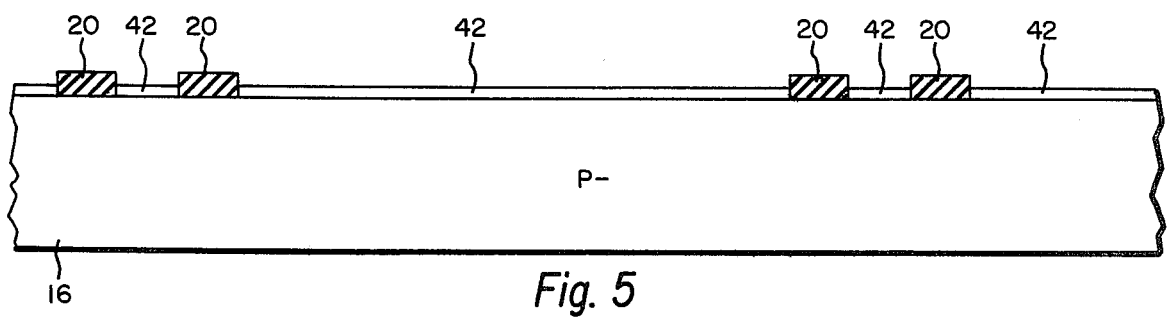

The next operations involve forming the several secondary masks for selective diffusion of impurities to form the collector, base, and emitter regions. While the specific description will be given for forming the secondary mask from silicon dioxide, it will be understood that the secondary mask can be formed from photoresist material where it is desired to use an ion implanter as the dopant deposition technique, as previously described. Typically, the photoresist has a thickness of about one micron or more. Turning now to FIG. 5, the substrate 16 is coated with a thin layer 42 of silicon dioxide. The thin silicon dioxide layer 42 may be thermally grown in a manner similar to that used for forming the thick layer 20, by heating the substrate 16 in oxygen saturated with water vapor, but at a lower temperature than that used for the thick layer 20. For forming a layer that is 2000 angstroms thick, the substrate 16 may be heated at 900°C for about one hour. There is no significant additional growth in the thick mask 20 at this lower temperature.

Figure 6:
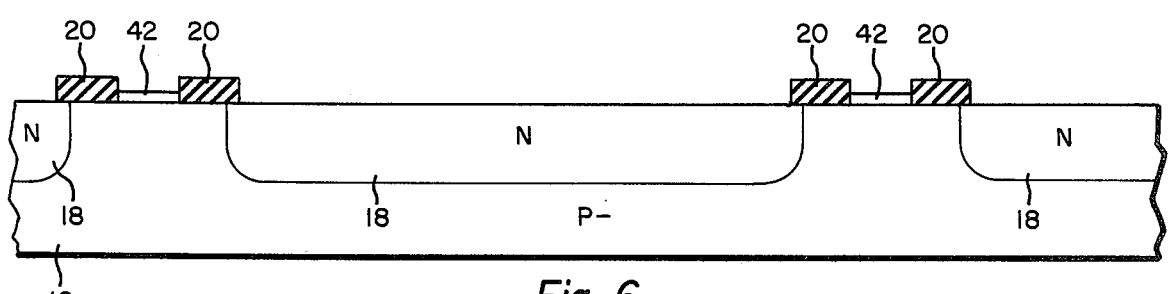

By a photolithographic masking and etching technique similar to that described above for the permanent mask 20, portions of the thin silicon dioxide layer 42 are removed from the regions of the substrate 16 where diffusions are to occur to form the collector regions. As shown in FIG. 6, the thin silicon dioxide layer 42 is left standing in regions where no diffusions are to occur. The stage of the process shown in FIG. 6 corresponds to the formation in FIG. 1 of a thin silicon dioxide secondary mask superimposed over the permanent mask 20 so as to cover only the spaces between the large rectangles 10 and leaving uncovered the rectangular opening running between points 1, 5, 6, 11. Buffered hydrofluoric acid is used to etch the thin silicon dioxide layer 42. The thick silicon dioxide layer that forms the permanent mask 20 is also slightly etched, however this reduction in thickness does not impare its masking capability.

FIG. 6 also illustrates the next step which is to diffuse a moderate concentration of an N type impurity into the P-type substrate to form the collector regions 18 which define the extent of each transistor 17. The collector regions 18 may be formed, for example, either by thermally diffusing arsenic into the semiconductor substrate 16 or by implanting phosphorous ions into the substrate and thereafter thermally distributing the impurity atoms. The ion implantation process has certain advantages in that the concentration of impurities is more uniform over the region and more controllable.

Figure 7:
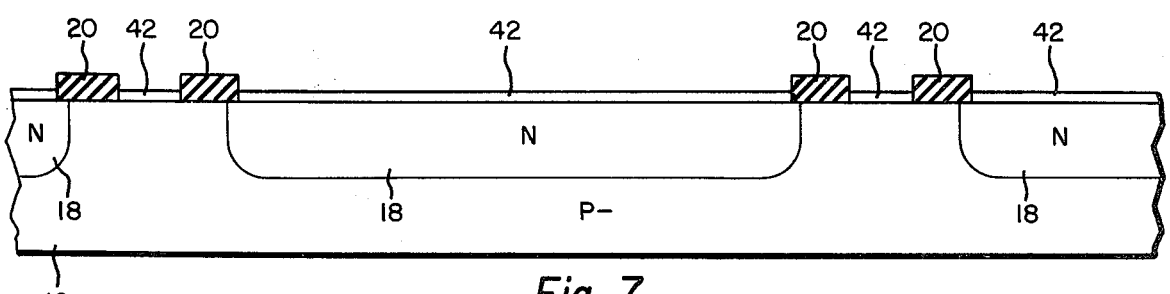

After the collector regions 18 are formed, another thin silicon dioxide layer 42 is grown over to cover the substrate 16, as shown in FIG. 7. Next, portions of the thin silicon dioxide layer 42 are removed to define the regions where the next diffusion is to occur to form the base regions. This stage of the process is shown in FIG. 8 and corresponds to the formation in FIG. 1 of a thin silicon dioxide secondary mask superimposed over the permanent mask 20 and portions of the substrate 16 within the inner rectangle 12, leaving a rectangular opening between points 3, 5, 6, 8, and leaving exposed all of the substrate regions between the large rectangles 10.

Figure 8:
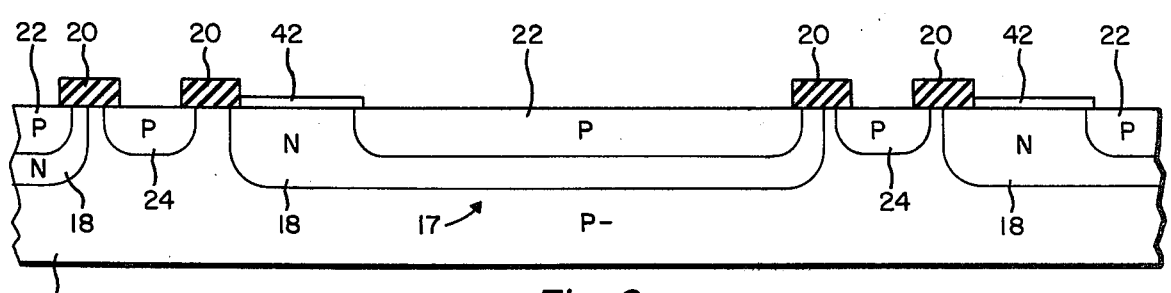

The next step in the process, also shown in FIG. 8, is to convert a portion of the N type collector regions 18 into the P type base regions 22, and also to form the P type isolation regions 24 within the P− type regions of the substrate 16 so that the isolation regions 24 surround the transistors 17. This is done by thermally diffusing a moderate concentration of a P type impurity such as boron.

Figure 9:
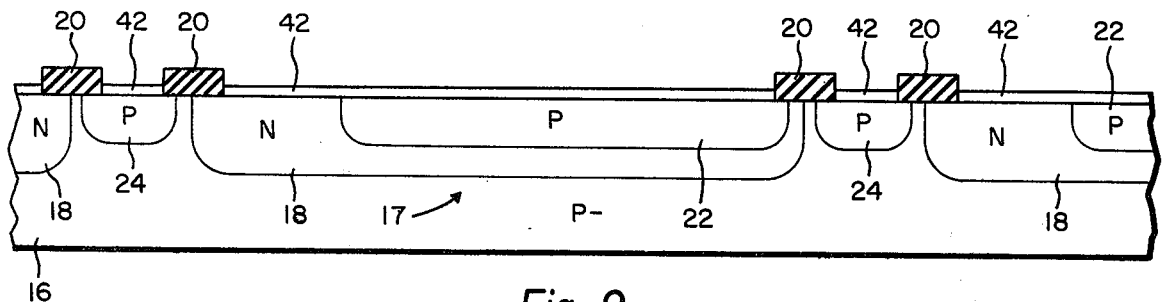

After the base regions 22 and the isolation regions 24 are formed, another thin silicon dioxide layer 42 is grown to cover the substrate 16, as shown in FIG. 9. Next, portions of the thin silicon dioxide layer 42 are removed to define the regions where the next diffusion is to occur to form the emitter regions and the collector contact regions. This stage of the process is shown in FIG. 10, and corresponds to the formation of FIG. 1 of a thin silicon dioxide secondary mask superimposed over the permanent mask 20 and portions of the substrate 16, leaving a rectangular opening between points 4, 5, 6, 7, and another rectangular opening between points 1, 2, 9, 11.

Figure 10:
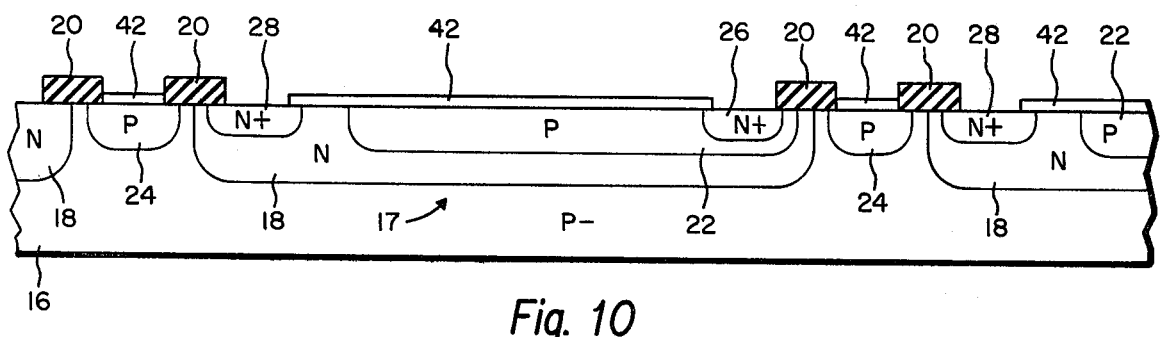

The next step of the process is also shown in FIG. 10 and that is the diffusion of a heavy concentration of an N type impurity, such as arsenic or phosphorus, to form the N+ emitter regions 26 within the P type base regions 22 and also the N+ collector contact regions 28 within the collector regions 18.

Figure 11:
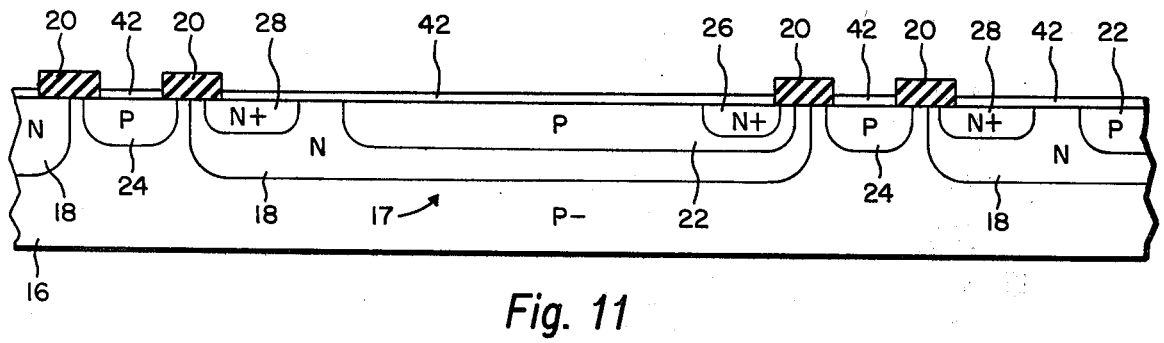
Figure 12:
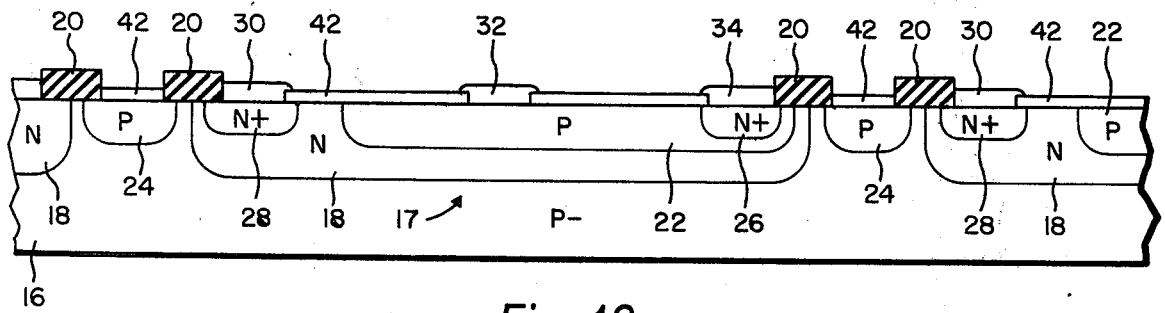

After the emitter regions 26 and collector contact regions 28 are formed, the next step in the process is to cover the substrate 16 with another thin silicon dioxide layer 42, as shown in FIG. 11. Portions of the thin silicon dioxide layer 42 are then removed to define the regions where ohmic contact will be made to the collector, base and emitter by depositing metal thereon. As shown in FIG. 12, which is similar to FIG. 2, holes are formed in the silicon dioxide layer 42 over the N+ collector contact region 28, over the N+ emitter region 26 and over the base region 22. In these holes are deposited metallic contacts which are identified as collector contact 30, emitter contact 32, and base contact 34. The metallic contacts may extend over the silicon dioxide layer 42 in the form of strips or bands to form various desired interconnection paths.

By way of example, typical values of resistivity, depth junction and surface impurity concentration will now be given. The resistivity of the substrate is 3 ohm-centimeters corresponding to a concentration of boron impurity atoms of $2 \times 10^{15}$ per cubic centimeters ($cm^3$). For the first diffusion, the N type collector region 18 has a depth of its junction with the P− type zone of the substrate 16 from the surfaces of the substrate 16 of $4.2 \times 10^{-4}$ cm. The sheet resistance of the N type collector region 18 is 88 ohms per square with a surface concentration of $1.8 \times 10^{18}$ impurity atoms per $cm^3$.

For the second diffusion, the sheet resistance of the P type base region 22 and P type isolation regions 24 is 116 ohms per square and the depth of the junctions from the surface is $1.9 \times 10^{-4}$ cm. The surface concentration is $1.5 \times 10^{19}$ boron atoms per cm³. Finally, for the third diffusion, the sheet resistance of the N+ type emitter region 26 and N+ type collector contact region 28 is 4.2 ohms per square. The depth of the junctions from the surface is $1.4 \times 10^{-4}$ cm and the concentration of impurity atoms per cm³ is $1.5 \times 10^{21}$.

The P isolation regions 24 are needed to isolate the transistors from each. If the P isolation regions 24 were omitted, the lightly doped P− regions where they are omitted normally contain a thin surface layer of N type conductivity that causes conducting channels to form between the transistors. The P isolation regions 24 prevent these conducting channels from forming.

Although the process above described has assumed perfect alignment of the masking structures, misalignment at every processing step by an amount approximately equal to S/2 can be tolerated without appreciably altering the structure for its intended purpose.

One advantage afforded by the method of the invention in constructing the integrated circuit bipolar transistor is that the lateral area is minimum. Very high packing densities are therefore practical to achieve, and packing densities as high as three transistors per square mil may be feasible.

A second advantage may be found in the relatively fewer processing steps that are required as compared with conventional methods. This should result beneficially in higher yields and lower cost.

One disadvantage resulting from the type of bipolar transistor is its lower performance figure. This is due to the high degree of chemical impurity concentration occurring in the base region. This reduces mobility and the alpha cutoff frequency. The structure is also limited in junction breakdown voltage because of high impurity concentrations at the surface. However, both alpha cutoff and junction breakdown are sufficient for a large number of useful circuits, particularly low power switching circuits such as all commonly found in LSI arrays. The bipolar transistors formed according to the method of the invention can replace the MOS type devices in such circuits with significant advantages in stability, speed, and cost.

In the transistor structure above described, the base is located between the collector and emitter, with the result that the collector and emitter are spaced quite far apart. Although such construction is preferred from the standpoint of space conservation, it may be preferred to sacrifice some space in the interest of reducing the parasitic collector resistance. Two such structures are disclosed in concurrently filed application, Ser. No. 363,995, now U.S. Pat. No. 3,885,994 of Ralph W. Miller, entitled BIPOLAR TRANSISTOR CONSTRUCTION METHOD, and assigned to the same assignee herein. In one structure, the transistor is elongated similar to the one disclosed herein, but the collector and base are located at the ends with the emitter in between. In another structure, the transistor is substantially square in extent and the collector is spaced close to both the emitter and base. The method of the invention described herein can be used to fabricate both structures disclosed in said application of Ralph W. Miller.

What is claimed is:

1. A method of fabricating an integrated circuit array of bipolar transistors utilizing a triple diffusion process, comprising:
    a. forming on a semiconductor substrate surface of first conductivity type a permanent masking layer of substantial thickness defining a multiplicity of rectangular openings of width S and length 6S, where S equals about 0.1 mil, with each opening surrounded by a rectangular masking region of width S, and with adjacent masking regions separated from each other by a continuous unmasked region of width S, said rectangular opening being capable of division into six zones of equal area arranged in a row and identified as zones 1 through 6 taken consecutively;
    b. applying a first masking layer of etchable material substantially thinner than said permanent masking layer over the surface of said substrate defined by said continuous region;
    c. diffusing an impurity of second conductivity type into surface regions of said substrate defined by all six zones of said rectangular openings to form collector regions within said substrate;
    d. applying a second masking layer of said etchable material over the surface of said substrate defined by all six zones of said rectangular openings;
    e. etching said etchable material from said continuous region and from zones 3 through 6 of said rectangular openings;
    f. diffusing an impurity of said first conductivity type into surface regions of said substrate defined by said continuous region and said zones 3 through 6 of said rectangular openings to form isolation regions surrounding all of the collector regions of said array and to form base regions within said collector regions;
    g. applying a third masking layer of said etchable material over the surface of said substrate defined by said continuous region and said zones 3 through 6 of said rectangular openings;
    h. etching said etchable material from zones 1 and 6 of said rectangular openings;
    i. diffusing an impurity of said second conductivity type into surface regions of said substrate defined by said zones 1 and 6 of said rectangular openings to form collector contact regions within said collector regions and emitter regions within said base regions;
    j. applying a fourth masking layer of said etchable material over the surface of said substrate defined by said zones 1 and 6 of said rectangular openings;
    k. etching said etchable material from zones 1, 4, and 6 of said rectangular openings; and
    l. depositing metal through said zones 1, 4, and 6 of said rectangular openings to form metallic contacts to said collector contact, base, and emitter regions, respectively.

2. The invention according to claim 1, wherein said substrate is silicon, said permanent masking layer is formed by thermally growing a relatively thick oxide layer on said silicon substrate, and said masking layers of etchable material are formed by thermally growing relatively thin layers of oxide on said silicon substrate.

3. The invention according to claim 2, wherein said impurity diffusions are performed simultaneously with the introduction of impurity ions into said semi-conductor substrate.

4. The invention according to claim 1, wherein said substrate is silicon, said permanent masking layer is formed by thermally growing a relatively thick oxide layer on said silicon substrate, and said masking layers of etchable material are formed by depositing photoresist material on said silicon substrate.

5. The invention according to claim 4, wherein said impurity diffusions are preceded by the step of introducing impurity ions into said silicon substrate by a process of ion implantation.

* * * * *